(12) United States Patent
Sakashita

(10) Patent No.: US 10,532,764 B2
(45) Date of Patent: Jan. 14, 2020

(54) MOTOR DRIVING DEVICE, FAILURE DIAGNOSIS METHOD FOR MOTOR DRIVING DEVICE, AND ELECTRIC POWER STEERING APPARATUS USING MOTOR DRIVING DEVICE

(71) Applicant: Hitachi Automotive Systems, Ltd., Hitachinaka-shi, Ibaraki (JP)

(72) Inventor: Tomio Sakashita, Isesaki (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 16/083,763

(22) PCT Filed: Feb. 6, 2017

(86) PCT No.: PCT/JP2017/004229
§ 371 (c)(1),
(2) Date: Sep. 10, 2018

(87) PCT Pub. No.: WO2017/175466
PCT Pub. Date: Oct. 12, 2017

(65) Prior Publication Data
US 2019/0077441 A1    Mar. 14, 2019

(30) Foreign Application Priority Data

Apr. 6, 2016    (JP) ................ 2016-076304

(51) Int. Cl.
*B62D 5/04*    (2006.01)
*H02P 27/06*    (2006.01)
*G01R 31/327*    (2006.01)

(52) U.S. Cl.
CPC ........... *B62D 5/046* (2013.01); *B62D 5/0409* (2013.01); *G01R 31/3278* (2013.01); *H02P 27/06* (2013.01)

(58) Field of Classification Search
CPC ........ B62D 5/04; B62D 5/0409; B62D 5/046; H02P 27/06; G01R 31/3278
(Continued)

(56) References Cited

U.S. PATENT DOCUMENTS

2008/0234897 A1* 9/2008 Tsuchida ............. B60W 50/029
                                                    701/42
2009/0201650 A1* 8/2009 Hauser .................. A01D 34/78
                                                    361/736
(Continued)

FOREIGN PATENT DOCUMENTS

JP      2002-44990 A    2/2002
JP      2004-135389 A   4/2004
(Continued)

OTHER PUBLICATIONS

International Search Report (PCT/ISA/210) issued in PCT Application No. PCT/JP2017/004229 dated Apr. 18, 2017 with English translation (seven (7) pages).
(Continued)

*Primary Examiner* — Atul Trivedi
(74) *Attorney, Agent, or Firm* — Crowell & Moring LLP

(57) ABSTRACT

A motor driving device is operable with low current consumption at low cost and can be started up without delay. The motor driving device includes inverter circuits, relay circuits, power supply stabilizing capacitors, pre-charge circuits, and a control unit. The inverter circuits individually drive coil sets of a motor. Each relay circuit is provided between a power supply and a corresponding one of the inverter circuits. Each capacitor is provided between a corresponding one of the relay circuits and a corresponding one of the inverter circuits. The pre-charge circuits, which are provided corresponding individually to the capacitors, each charge a corresponding one of the capacitors before the relay circuits are driven. The control unit controls the pre-charge circuits so that the pre-charge circuits charge the capacitors at mutually different timings or alternately when failure diagnosis is performed on the relay circuits.

20 Claims, 10 Drawing Sheets

(58) Field of Classification Search
USPC .......................................................... 701/41
See application file for complete search history.

(56) References Cited

U.S. PATENT DOCUMENTS

| | | | | |
|---|---|---|---|---|
| 2009/0306841 | A1* | 12/2009 | Miwa .................... | B60L 53/305 |
| | | | | 701/22 |
| 2011/0066331 | A1* | 3/2011 | Yamashita ........... | B62D 5/0463 |
| | | | | 701/42 |
| 2011/0247323 | A1* | 10/2011 | Kenway .................... | F02C 6/16 |
| | | | | 60/415 |
| 2012/0161681 | A1 | 6/2012 | Kuroda | |
| 2014/0055059 | A1 | 2/2014 | Uryu et al. | |
| 2014/0326530 | A1* | 11/2014 | Asao .................... | B62D 5/0406 |
| | | | | 180/443 |
| 2015/0069829 | A1* | 3/2015 | Dulle ..................... | B60R 16/03 |
| | | | | 307/9.1 |
| 2015/0295490 | A1* | 10/2015 | Yamagami ............... | B60L 3/00 |
| | | | | 363/49 |
| 2015/0295514 | A1* | 10/2015 | Yamagami ........ | H02M 7/53871 |
| | | | | 363/98 |
| 2015/0298727 | A1* | 10/2015 | Kimpara .............. | B62D 5/0484 |
| | | | | 701/43 |
| 2017/0131378 | A1* | 5/2017 | Murata ................... | B60L 58/10 |
| 2018/0287538 | A1* | 10/2018 | Nakashima ............ | B62D 5/046 |

FOREIGN PATENT DOCUMENTS

| | | |
|---|---|---|
| JP | 2012-139021 A | 7/2012 |
| JP | 2014-45576 A | 3/2014 |
| WO | WO 2014/184888 A1 | 11/2014 |

OTHER PUBLICATIONS

Japanese-language Written Opinion (PCT/ISA/237) issued in PCT Application No. PCT/JP2017/004229 dated Apr. 18, 2017 with English translation (six (6) pages).

International Preliminary Report on Patentability (PCT/IB/338 & PCT/IB/373) issued in PCT Application No. PCT/JP2017/004229 dated Oct. 18, 2018, including English translation of document C2 (Japanese-language Written Opinion (PCT/ISA/237) previously filed on Sep. 10, 2018) (six (6) pages).

\* cited by examiner

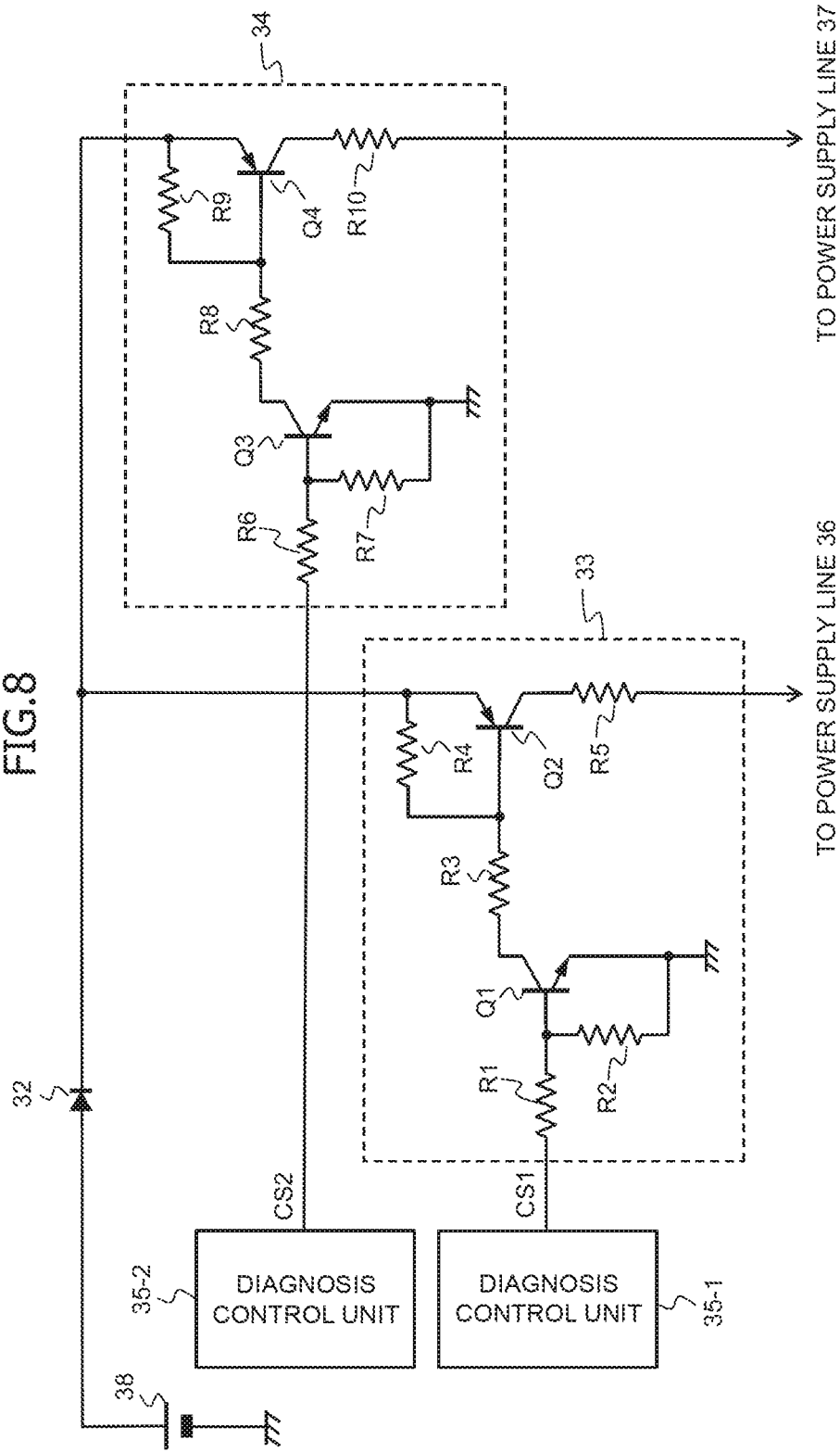

MOTOR DRIVING DEVICE, FAILURE DIAGNOSIS METHOD FOR MOTOR DRIVING DEVICE, AND ELECTRIC POWER STEERING APPARATUS USING MOTOR DRIVING DEVICE

TECHNICAL FIELD

The present invention relates to a motor driving device for driving a motor including a plurality of coil sets, the motor driving device including a plurality of driver circuits of different energization systems for individually driving the plurality of coil sets, and relates to a failure diagnosis method for the motor driving device and to an electric power steering apparatus using the motor driving device.

BACKGROUND ART

Patent Document 1 discloses a failure diagnosis method for a power supply relay, i.e., a semiconductor relay for shutting off power supply, included in a motor controller. In this failure diagnosis method, the power supply stabilizing capacitor in the inverter circuit is charged and the turning on and off of the power supply relay is controlled so as to detect a short circuit failure or a disconnection failure therein. Patent Document 2 discloses a pre-charge circuit for a power supply stabilizing capacitor included in a motor driving device, and the pre-charge circuit charges the power supply stabilizing capacitor via a resistor.

REFERENCE DOCUMENT LIST

Patent Documents

Patent Document 1 JP 2012-139021 A
Patent Document 2 JP 2004-135389 A

SUMMARY OF THE INVENTION

Problem to be Solved by the Invention

Here, a so-called redundant electric power steering (EPS) architecture is employed in an EPS apparatus using a motor controller or a motor driving device as described above. The redundant EPS architecture, which uses a plurality of driver circuits to drive the motor, allows continuation of assisting the steering of the vehicle with a reduced steering assist force even after a failure has occurred in the motor controller or motor driving device. Such a motor driving device includes power supply relays and capacitors individually for the plurality of driver circuits. Thus, to allow failure diagnosis of each of the power supply relays, the motor driving device is required to have a plurality of pre-charge circuits individually for the energization systems.

However, in a motor driving device including a plurality of driver circuits of different energization systems, simultaneously driving the plurality of pre-charge circuits to perform failure diagnosis on the power supply relays will increase a charging current supplied to the power supply stabilizing capacitors, and will increase overall current consumption. Furthermore, simultaneously activating the plurality of pre-charge circuits results in an increase in the peak current, thus requiring an increase of the ratings of the semiconductor elements in common circuit units such as in functional units for protection against reverse connection of the power supply, and may lead to increased cost.

A conceivable measure to suppress an increase in current consumption is to increase the resistance values of the resistors for limiting the charging currents. However, the greater the resistance values are, the more time it takes to charge the power supply stabilizing capacitors, and thus, the more time it takes to start up the motor driving device. However, the electric power steering apparatus is required to start up its motor immediately upon receiving a command to start the vehicle, and delaying the startup of the motor driving device leads to a delay in response of the steering operation, which is not preferable.

The present invention has been made in view of the above circumstances, and an object thereof is to provide a motor driving device that is operable with low current consumption and at low cost and can be started up without delay, a failure diagnosis method for the motor driving device, and an electric power steering apparatus using the motor driving device.

Means for Solving the Problem

According to an aspect of the present invention, a motor driving device for driving a motor including a plurality of coil sets comprises: a plurality of inverter circuits for individually driving the plurality of coil sets; a plurality of relay circuits each provided between a power supply and a corresponding one of the plurality of inverter circuits; a plurality of power supply stabilizing capacitors each provided between a corresponding one of the plurality of relay circuits and a corresponding one of the plurality of inverter circuits; a plurality of pre-charge circuits provided corresponding individually to the plurality of power supply stabilizing capacitors, each pre-charge circuit charging a corresponding one of the power supply stabilizing capacitors before the plurality of relay circuits are driven; and a control unit for controlling the plurality of pre-charge circuits so that the plurality of pre-charge circuits charge the plurality of power supply stabilizing capacitors at mutually different timings or alternately when failure diagnosis is performed on the plurality of relay circuits.

According to another aspect of the present invention, a failure diagnosis method is provided for a motor driving device for driving a motor including a plurality of coil sets, the motor driving device including a plurality of inverter circuits for individually driving the plurality of coil sets; a plurality of relay circuits each provided between a power supply and a corresponding one of the plurality of inverter circuits; a plurality of power supply stabilizing capacitors each provided between a corresponding one of the plurality of relay circuits and a corresponding one of the plurality of inverter circuits; and a plurality of pre-charge circuits provided corresponding individually to the plurality of power supply stabilizing capacitors, each pre-charge circuit charging a corresponding one of the power supply stabilizing capacitors before the plurality of relay circuits are driven. The failure diagnosis method comprises the steps of: causing the plurality of pre-charge circuits to charge the plurality of power supply stabilizing capacitors at mutually different timings or alternately; driving the plurality of relay circuits after charging of the plurality of power supply stabilizing capacitors has been completed; measuring voltages of the plurality of relay circuits; and identifying failure based on the measured voltages of the plurality of relay circuits.

According to yet another aspect of the present invention, an electric power steering apparatus is provided which uses a motor driving device to control a steering force assisting motor including a plurality of coil sets so that the steering force assisting motor produces a steering assist force in accordance with a traveling state of a vehicle. The motor driving device includes: a plurality of inverter circuits for individually driving the plurality of coil sets of the steering force assisting motor; a plurality of relay circuits each provided between a power supply and a corresponding one of the plurality of inverter circuits; a plurality of power supply stabilizing capacitors each provided between a corresponding one of the plurality of relay circuits and a corresponding one of the plurality of inverter circuits; a plurality of pre-charge circuits provided corresponding individually to the plurality of power supply stabilizing capacitors, each pre-charge circuit charging a corresponding one of the power supply stabilizing capacitors before the plurality of relay circuits are driven; and a control unit for controlling the plurality of pre-charge circuits so that the plurality of pre-charge circuits charge the plurality of power supply stabilizing capacitors at mutually different timings or alternately when failure diagnosis is performed on the plurality of relay circuits.

Effects of the Invention

According to the present invention, the plurality of pre-charge circuits charge the plurality of power supply stabilizing capacitors at mutually different timings or alternately. This suppresses the peak of the sum of charging currents, and thus eliminates the need to increase the resistance values of the resistors for limiting the peak currents. Thus, a delay in the startup of the motor driving device due to an increased charging time may be reduced or avoided. Furthermore, the present invention thus does not require an increase of the ratings of the elements such as functional units for protection against reverse connection of the power supply, and does not increase overall cost.

BRIEF DESCRIPTION OF THE DRAWINGS

FIG. 8, which is a circuit diagram for illustrating a motor driving device according to a second embodiment of the present invention, illustrates another configuration example of the diagnosis control unit.

MODES FOR CARRYING OUT THE INVENTION

Below, embodiments of the present invention will be described with reference to the drawings.

First Embodiment

Figure 1:
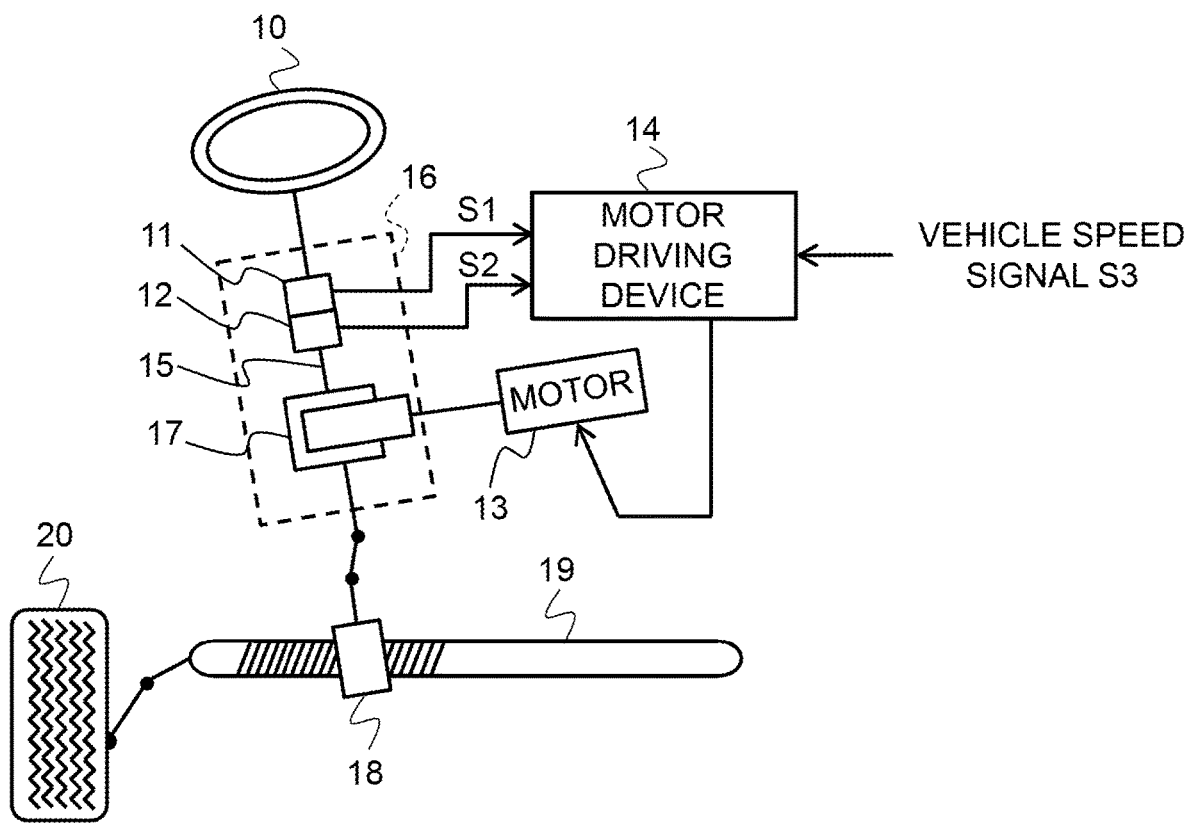
FIG. 1 is schematic configuration diagram of an EPS apparatus to which the present invention is applied.
Figure 2:
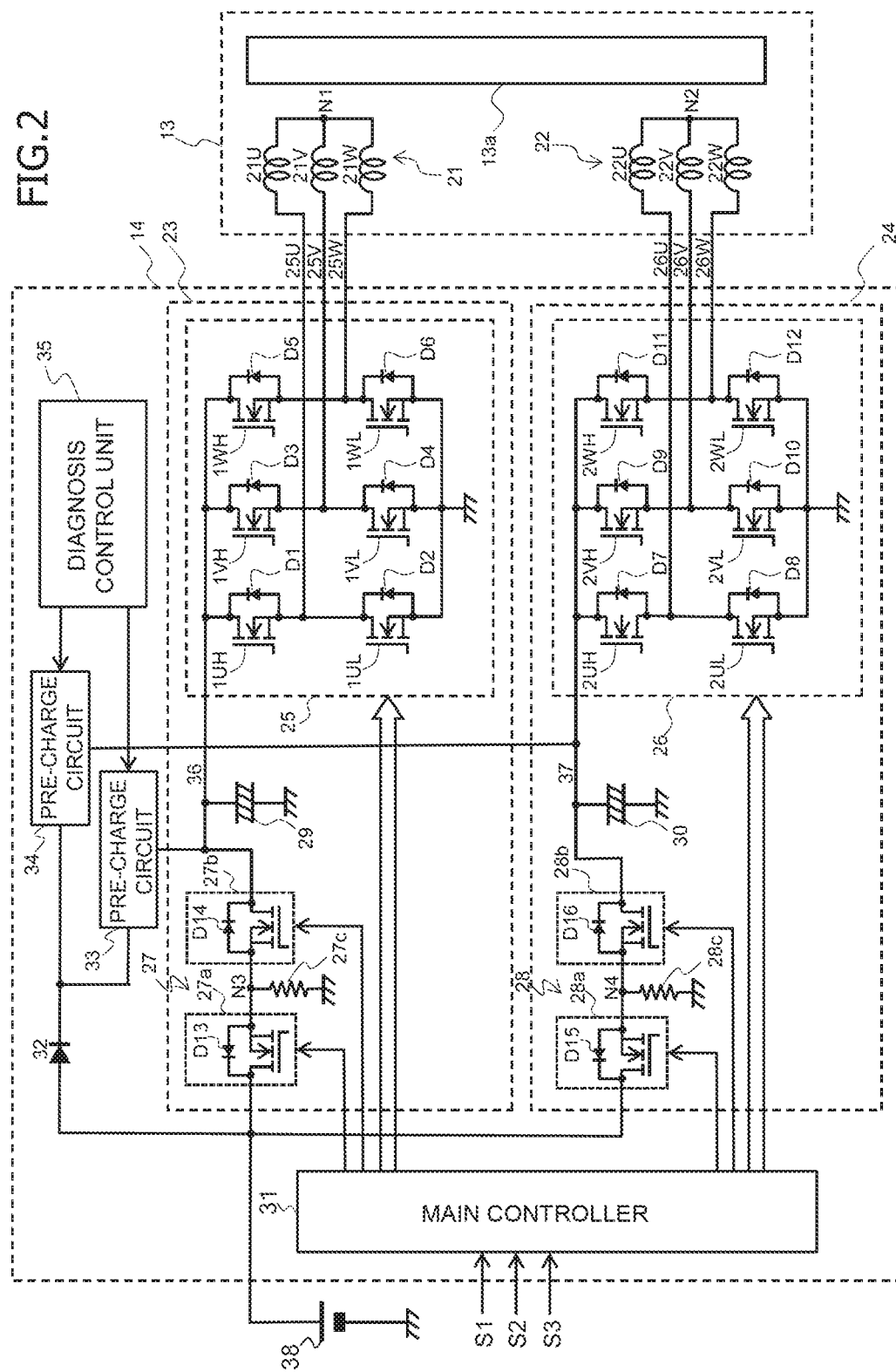
FIG. 2 is a circuit diagram of a motor driving device according to a first embodiment of the present invention.

FIG. 1 illustrates a schematic configuration of an EPS apparatus using a motor driving device of the present invention. FIG. 2 illustrates a circuit configuration of a motor driving device according to a first embodiment of the present invention. First, the EPS apparatus will be briefly described, and then the motor driving device that controls a motor (electric actuator) for assisting the steering force in this EPS apparatus will be described.

As illustrated in FIG. 1, the EPS apparatus includes a steering wheel 10, a steering torque sensor 11, a steering angle sensor 12, a steering force assisting motor 13, a motor driving device 14 for controlling motor 13, and the like. Steering torque sensor 11, steering angle sensor 12, and a reducer 17 are provided in a steering column 16 including a steering shaft 15.

Steering torque sensor 11 measures a steering torque of steering shaft 15 generated by the steering operation of the driver. Steering angle sensor 12 measures a steering angle. Based on a steering torque signal 51 and a steering angle signal S2 provided by sensors 11, 12, a vehicle speed signal S3 indicating the vehicle speed measured by the vehicle, and the like, motor driving device 14 controls the drive of motor 13 so that motor 13 produces a steering assist force in accordance with the traveling state of the vehicle. Thereby, a pinion gear 18 provided at an end of steering shaft 15 rotates, and a rack shaft 19 moves horizontally and sideways with respect to the vehicle travel direction. In this way, the steering operation of the driver is transmitted to wheels (tires) 20 and turns the vehicle around.

In the motor driving device illustrated in FIG. 2, motor 13, which is a three-phase brushless motor, has a stator (not illustrated in the drawings) and a rotor 13a. The stator includes a first coil set 21 of a U-phase coil 21U, a V-phase coil 21V, and a W-phase coil 21W, and a second coil set 22 of a U-phase coil 22U, a V-phase coil 22V, and a W-phase coil 22W. The rotor 13a, which is a permanent magnet rotor, is rotatably disposed in a center portion of the stator.

Coil sets 21, 22 are wound around the stator so as to be insulated from each other and share a magnetic circuit. One ends of U-phase coil 21U, V-phase coil 21V, and W-phase coil 21W in coil set 21 are electrically connected to each other at a neutral point N1; in other words, U-phase coil 21U, V-phase coil 21V, and W-phase coil 21W are star-connected. Similarly, one ends of U-phase coil 22U, V-phase coil 22V, and W-phase coil 22W in coil set 22 are electrically connected to each other at a neutral point N2; in other words, U-phase coil 22U, V-phase coil 22V, and W-phase coil 22W are star-connected. Note, however, that motor driving device 14 according to any of the embodiments may also be used for a motor including delta-connected three-phase coils.

In motor 13, coil sets 21, 22 are selectively driven by a driver circuit 23 of a first energization system and a driver circuit 24 of a second energization system, respectively. Driver circuit 23 includes an inverter circuit 25, a relay circuit 27 (a power supply relay 27a, a reverse-connection shut-off relay 27b, and a pull-down resistor 27c), a power supply stabilizing capacitor 29, and the like. Driver circuit 24 includes an inverter circuit 26, a relay circuit 28 (a power supply relay 28a, a reverse-connection shut-off relay 28b, and a pull-down resistor 28c), a power supply stabilizing capacitor 30, and the like.

Inverter circuit 25 has a three-phase bridge circuit including three pairs of semiconductor elements. Each pair of semiconductor elements drives the corresponding one of U-phase coil 21U, V-phase coil 21V and W-phase coil 21W in the first energization system of motor 13 through the corresponding one of drive lines 25U, 25V, 25W. In this example, the semiconductor elements are N-channel MOSFETs 1UH, 1UL, 1VH, 1VL, 1WH, 1WL.

The drain-source paths of MOSFETs 1UH, 1UL are connected in series between a power supply line 36 and a ground point. One end of drive line 25U is connected to the common connection point of MOSFETs 1UH, 1UL. The drain-source paths of MOSFETs 1VH, 1VL are connected in series between power supply line 36 and the ground point. One end of drive line 25V is connected to the common connection point of MOSFETs 1VH, 1VL. The drain-source paths of MOSFETs 1WH, 1WL are connected in series between power supply line 36 and the ground point. One end of drive line 25W is connected to the common connection point of MOSFETs 1WH, 1WL. In MOSFETs 1UH, 1UL, 1VH, 1VL, 1WH, 1WL, diodes D1 to D6, each of which is connected in the forward direction between the source and the drain, are parasitic diodes.

Like inverter circuit 25, inverter circuit 26 has a three-phase bridge circuit including three pairs of semiconductor elements. Each pair of semiconductor elements drives the corresponding one of U-phase coil 22U, V-phase coil 22V and W-phase coil 22W in the second energization system of motor 13 through the corresponding one of drive lines 26U, 26V, 26W. In this example, the semiconductor elements are N-channel MOSFETs 2UH, 2UL, 2VH, 2VL, 2WH, 2WL.

The drain-source paths of MOSFETs 2UH, 2UL are connected in series between a power supply line 37 and the ground point. One end of drive line 26U is connected to the common connection point of MOSFETs 2UH, 2UL. The drain-source paths of MOSFETs 2VH, 2VL are connected in series between power supply line 36 and the ground point. One end of drive line 26V is connected to the common connection point of MOSFETs 2VH, 2VL. The drain-source paths of MOSFETs 2WH, 2WL are connected in series between power supply line 36 and the ground point. One end of drive line 26W is connected to the common connection point of MOSFETs 2WH, 2WL. In MOSFETs 2UH, 2UL, 2VH, 2VL, 2WH, 2WL, diodes D7 to D12, each of which is connected in the forward direction between the source and the drain, are parasitic diodes.

Electric power from a DC power supply 38 (battery power) is supplied to inverter circuit 25 through relay circuit 27 and power supply line 36, and supplied to inverter circuit 26 through relay circuit 28 and power supply line 37. In the first energization system, relay circuit 27 includes two semiconductor elements (N-channel MOSFETs, in this example) 27a, 27b. The current paths to MOSFETs 27a, 27b are connected in series between DC power supply 38 and inverter circuit 25. In the second energization system, relay circuit 28 includes two semiconductor elements (N-channel MOSFETs, in this example) 28a, 28b. The current paths to MOSFETs 28a, 28b are connected in series between DC power supply 38 and inverter circuit 26. When an abnormality occurs in either of these energization systems, fail-safe processing is performed so as to turn off the relay circuit of this abnormal system and shut off power supply to the inverter circuit connected downstream to the relay circuit.

In relay circuit 27, two MOSFETs 27a, 27b are arranged such that the forward directions of their parasitic diodes D13, D14 are opposite to each other. In relay circuit 28, two MOSFETs 28a, 28b are arranged such that the forward directions of their parasitic diodes D15, D16 are opposite to each other. This aims to prevent formation of a closed circuit and resultant generation of a short circuit current even if DC power supply 38 is connected to motor driving device 14 with reverse polarity by accident. MOSFETs 27a, 28a are power supply relays. MOSFETs 27b, 28b are reverse connection protection relays, each of which serves as a functional unit for reverse connection protection. Pull-down resistor 27c discharges electric charges at a connection point N3 of the current paths to MOSFETs 27a, 27b when failure diagnosis is performed on relay circuit 27. Pull-down resistor 28c discharges electric charges at a connection point N4 of the current paths to MOSFETs 28a, 28b when failure diagnosis is performed on relay circuit 28.

Power supply stabilizing capacitor 29 is provided between relay circuit 27 and inverter circuit 25. Power supply stabilizing capacitor 30 is provided between relay circuit 28 and inverter circuit 26. One electrode of capacitor 29 is connected to power supply line 36 to inverter circuit 25, and the other electrode is grounded. One electrode of capacitor 30 is connected to power supply line 37 to inverter circuit 26, and the other electrode is grounded. In addition, pre-charge circuits 33, 34 are provided corresponding to capacitors 29, 30, respectively. Before relay circuits 27, 28 are driven, pre-charge circuits 33, 34 receive an electric power from DC power supply 38 via a diode 32 and selectively charge capacitors 29, 30. A diagnosis control unit 35 controls pre-charge circuits 33, 34 so that the peak of the sum of their charging currents does not exceed a predetermined value such as the gate dielectric breakdown voltage of each of MOSFETs 27b, 28b included in relay circuits 27, 28.

Via drivers (not illustrated in the drawings), a main controller 31 controls inverter circuits 25, 26 and relay circuits 27, 28 of driver circuits 23, 24. Main controller 31 includes a calculation means such as a central processing unit (CPU) and a microprocessor, and a storage means such as a read only memory (ROM) and a random access memory (RAM). Based on the steering torque signal 51 and the steering angle signal S2 as well as the vehicle speed signal S3 indicating the vehicle speed measured by the vehicle, and the like, main controller 31 calculates a steering assist force necessary for assisting the steering operation of the driver (target steering assist force). Also, main controller 31 drives motor 13 by controlling driver circuits 23, 24 in accordance with the target steering assist force.

In the following description, the calculation means performs various calculations by reading and executing programs stored in advance in the storage means. However, the present invention is not limited to this. Alternatively, some or all of the calculations may be implemented by a hardware configuration. In the normal state, main controller 31 causes motor 13 to generate a torque corresponding to the target steering assist force using a total output current, which is the sum of the output currents of two driver circuits 23, 24. The ratio of the output current of driver circuit 23 to that of driver circuit 24 for the normal state, which is stored in advance in the storage means such as a ROM, is set to 50% to 50%, for example.

In accordance with the target steering assist force, main controller 31 calculates a target total output current to be supplied to motor 13. For example, a data table including a previously defined correspondence between the target steering assist force values and the target total output current values may be stored in the ROM or the like. In this case, by referring to the data table, the target total output current value corresponding to the target steering assist force value may be selected. Based on the target total output current and the output current ratio between inverter circuits 25, 26, main controller 31 calculates a first target output current for inverter circuit 25 and a second target output current for inverter circuit 26.

Main controller 31 generates control signals for individually turning on and off MOSFETs 1UH, 1UL, 1VH, 1VL, 1WH, 1WL of inverter circuit 25 and MOSFETs 2UH, 2UL, 2VH, 2VL, 2WH, 2WL of inverter circuit 26 by, for example, pulse width modulation (PWM) control. Via the drivers (not illustrated in the drawings), main controller 31 outputs these control signals individually to the gate terminals of the MOSFETs, thereby controlling the torque of motor 13.

When performing failure diagnosis on relay circuits 27, 28, diagnosis control unit 35 charges power supply stabilizing capacitors 29, 30 before relay circuits 27, 28 are driven. Diagnosis control unit 35, which includes a CPU and a microprocessor, is configured to perform control for causing pre-charge circuits 33, 34 to charge power supply stabilizing capacitors 29, 30 at mutually different timings or alternately.

Figure 3:
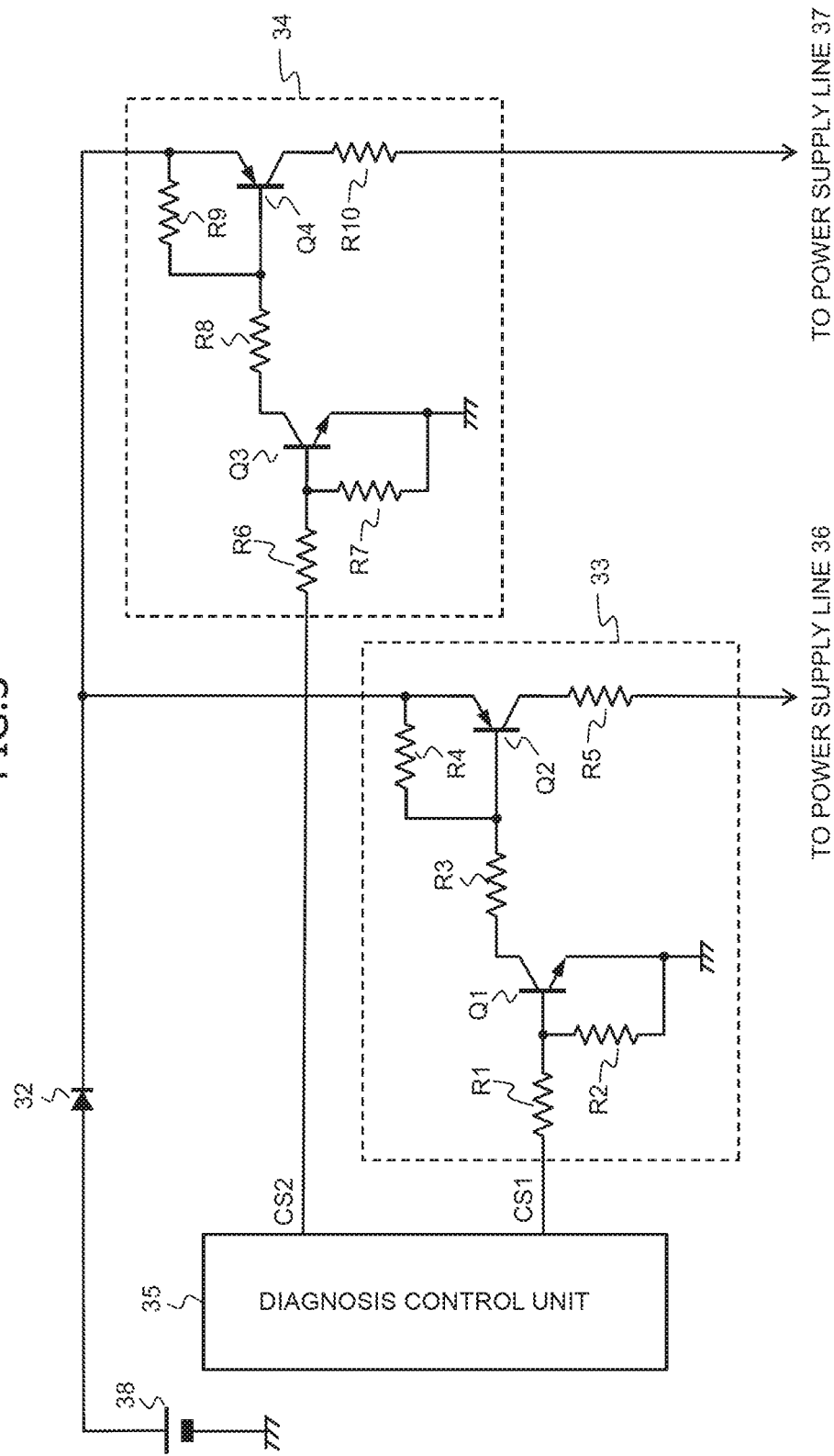
FIG. 3 is a circuit diagram illustrating a configuration example of the pre-charge circuits of FIG. 2.

FIG. 3 is a circuit diagram illustrating a configuration example of pre-charge circuits 33, 34 of FIG. 2. Pre-charge circuit 33 includes an NPN transistor Q1, a PNP transistor Q2, and resistors R1 to R5. One end of resistor R1 is connected to the first output terminal of diagnosis control unit 35 and the other end is connected to the base of NPN transistor Q1. Resistor R2 is connected between the base and the emitter of NPN transistor Q1. The emitter of NPN transistor Q1 is grounded, and the collector of NPN transistor Q1 is connected to one end of resistor R3. The other end of resistor R3 is connected to the base of PNP transistor Q2. Resistor R4 is connected between the base and the emitter of PNP transistor Q2. The emitter of PNP transistor Q2 is connected to the anode of diode 32, and the collector of PNP transistor Q2 is connected to power supply line 36 via resistor R5.

Resistors R1, R2 generate a voltage for controlling the turning on and off of NPN transistor Q1. Resistors R3, R4 generate a voltage for controlling the turning on and off of PNP transistor Q2. Resistor R5, which is provided in the charging path to power supply stabilizing capacitor 29, limits the charging current therefor.

Pre-charge circuit 34 has the same circuit configuration as pre-charge circuit 33. Pre-charge circuit 34 includes an NPN transistor Q3, a PNP transistor Q4, and resistors R6 to R10. One end of resistor R6 is connected to the second output terminal of diagnosis control unit 35 and the other end is connected to the base of NPN transistor Q3. Resistor R7 is connected between the base and the emitter of NPN transistor Q3. The emitter of NPN transistor Q3 is grounded, and the collector of NPN transistor Q3 is connected to one end of resistor R8. The other end of resistor R8 is connected to the base of PNP transistor Q4. Resistor R9 is connected between the base and the emitter of PNP transistor Q4. The emitter of PNP transistor Q4 is connected to the anode of diode 32, and the collector of PNP transistor Q4 is connected to power supply line 37 via resistor R10.

Resistors R6, R7 generate a voltage for controlling the turning on and off of NPN transistor Q3. Resistors R8, R9 generate a voltage for controlling the turning on and off of PNP transistor Q4. Resistor R10, which is provided in the charging path to power supply stabilizing capacitor 30, limits the charging current therefor.

Next, the operation of the motor driving device having the above configuration when performing failure diagnosis on relay circuits 27, 28 will be described. Before main controller 31 drives relay circuits 27, 28, diagnosis control unit 35 causes pre-charge circuits 33, 34 to charge power supply stabilizing capacitors 29, 30. Specifically, to charge power supply stabilizing capacitors 29, 30, diagnosis control unit 35 first outputs a driving signal CS1 for NPN transistor Q1 from the first output terminal. When the driving signal CS1 is supplied to the base of NPN transistor Q1, NPN transistor Q1 turns on and PNP transistor Q2 turns on. As a result, power supply stabilizing capacitor 29 starts to be charged by DC power supply 38 through diode 32, the emitter and collector of PNP transistor Q2, resistor R5, and power supply line 36.

After a predetermined time ΔT1 has elapsed, diagnosis control unit 35 outputs a driving signal CS2 for NPN transistor Q3 from the second output terminal. When the driving signal CS2 is supplied to the base of NPN transistor Q3, NPN transistor Q3 turns on and PNP transistor Q4 turns on. As a result, power supply stabilizing capacitor 30 starts to be charged by DC power supply 38 through diode 32, the emitter and collector of PNP transistor Q4, resistor R10, and power supply line 37.

The inter-terminal voltage (charging voltage) of power supply stabilizing capacitor 29 gradually rises, and reaches a voltage Vcharge1 after a predetermined time has elapsed. In addition, the inter-terminal voltage of power supply stabilizing capacitor 30 gradually rises, and reaches a voltage Vcharge2 after a predetermined time has elapsed. Here, power supply stabilizing capacitor 30 reaches the voltage Vcharge2 slightly after power supply stabilizing capacitor 29 reaches the voltage Vcharge1. When the inter-terminal voltages of power supply stabilizing capacitors 29, 30 rise respectively to Vcharge1, Vcharge2, diagnosis control unit 35 stops outputting the driving signals CS1, CS2 and completes the charging of power supply stabilizing capacitors 29, 30. In this way, diagnosis control unit 35 drives pre-charge circuits 33, 34 at mutually different timings.

After the charging of power supply stabilizing capacitors 29, 30 has been completed, main controller 31 controls the turning on and off of MOSFETs 27a, 27b, 28a, 28b of relay circuits 27, 28, and measures the voltage at the connection point N3 of the current paths to MOSFETs 27a, 27b and the voltage at the connection point N4 of the current paths to MOSFETs 28a, 28b. Based on the measured voltages, main controller 31 detects a short circuit failure or a disconnection failure. For example, the fact that the voltage at the connection point N3 rises to Vcharge1 while MOSFET 27b is turned off means that a short-circuit failure has occurred in MOSFET 27b. The fact that the voltage at the connection point N4 rises to Vcharge2 while MOSFET 28b is turned off means that a short-circuit failure has occurred in MOSFET 28b. The fact that the voltage at the connection point N3 does not rise to Vcharge1 while MOSFET 27b is turned on means that a disconnection failure has occurred in MOSFET 27b. The fact that the voltage at the connection point N4 does not rise to Vcharge2 while MOSFET 28b is turned on means that a disconnection failure has occurred in MOSFET 28b.

By controlling the turning on and off of MOSFETs 27a, 28a and MOSFETs 27b, 28b in different combinations, and taking into account the differences among the voltage VB of DC power supply 38 and the inter-terminal voltages Vcharge1, Vcharge2, main controller 31 can also detect a short circuit failure and a disconnection failure in MOSFETs 27a, 28a. Alternatively, instead of driving pre-charge circuits 33, 34 at mutually different timings, diagnosis control unit 35 may alternately output the driving signal CS1 for NPN transistor Q1 from the first output terminal and the driving signal CS2 for NPN transistor Q3 from the second output terminal so that power supply stabilizing capacitors 29, 30 are charged alternately for periods of a predetermined time ΔT2.

Figure 4A:
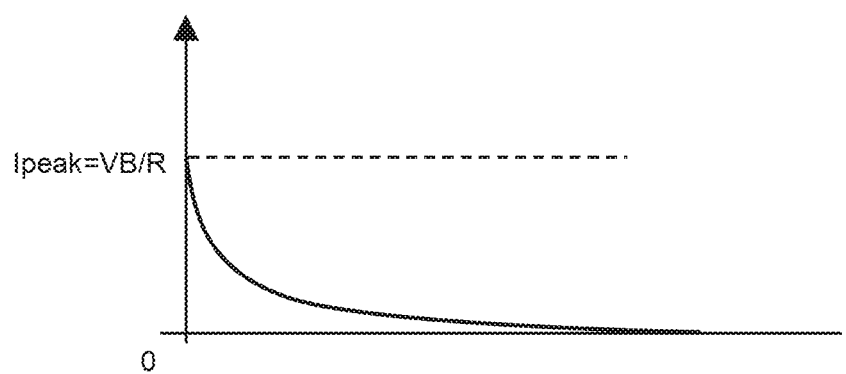
FIG. 4A is a waveform graph illustrating changes in the charging current supplied to a power supply stabilizing capacitor in a conventional motor driving device including a single energization system.
Figure 4B:
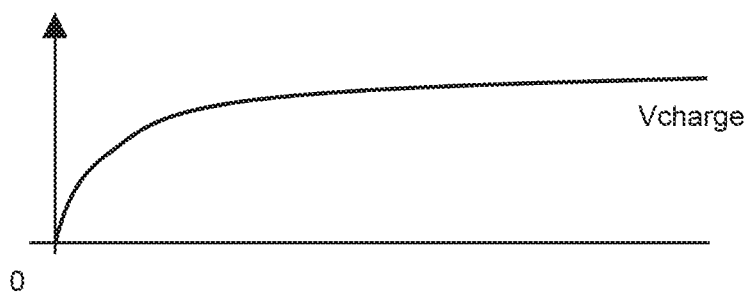
FIG. 4B is a waveform graph illustrating changes in the inter-terminal voltage of the power supply stabilizing capacitor in the conventional motor driving device including a single energization system.
Figure 5A:
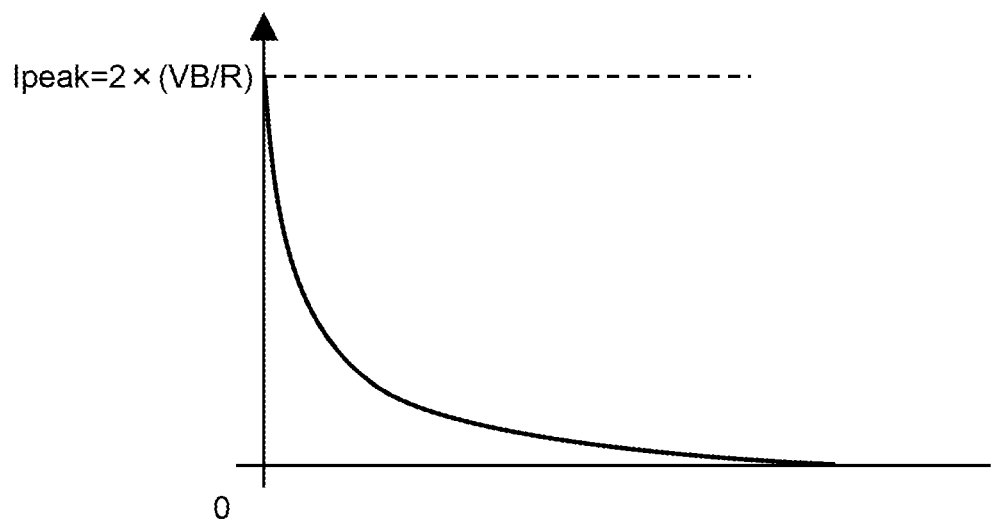
FIG. 5A is a waveform graph illustrating changes in the charging current supplied power supply stabilizing capacitors in a conventional motor driving device including two energization systems.
Figure 5B:
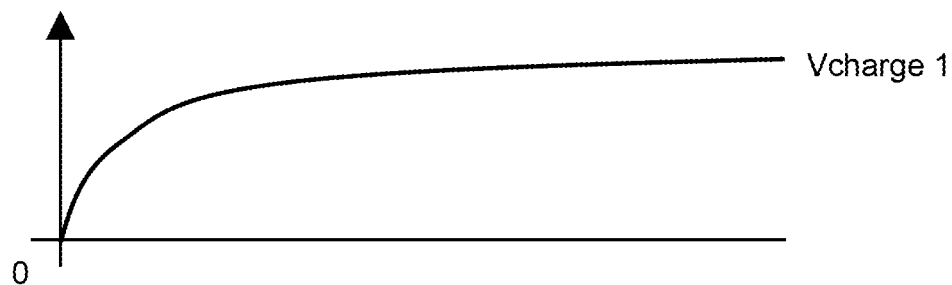
FIG. 5B is a waveform graph illustrating changes in the inter-terminal voltage of a power supply stabilizing capacitor in the conventional motor driving device including two energization systems.
Figure 5C:
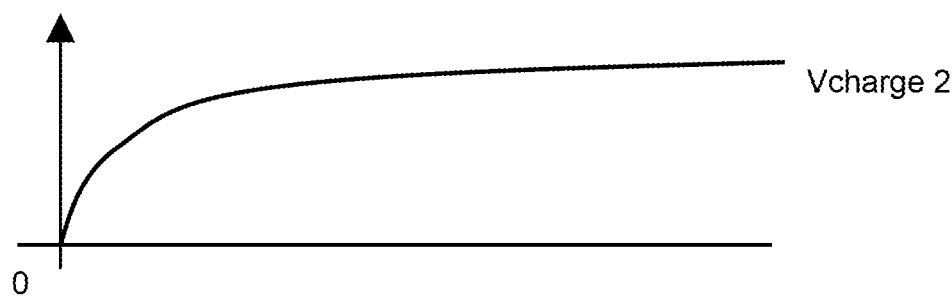
FIG. 5C is a waveform graph illustrating changes in the inter-terminal voltage of another power supply stabilizing capacitor in the conventional motor driving device including two energization systems.
Figure 6A:
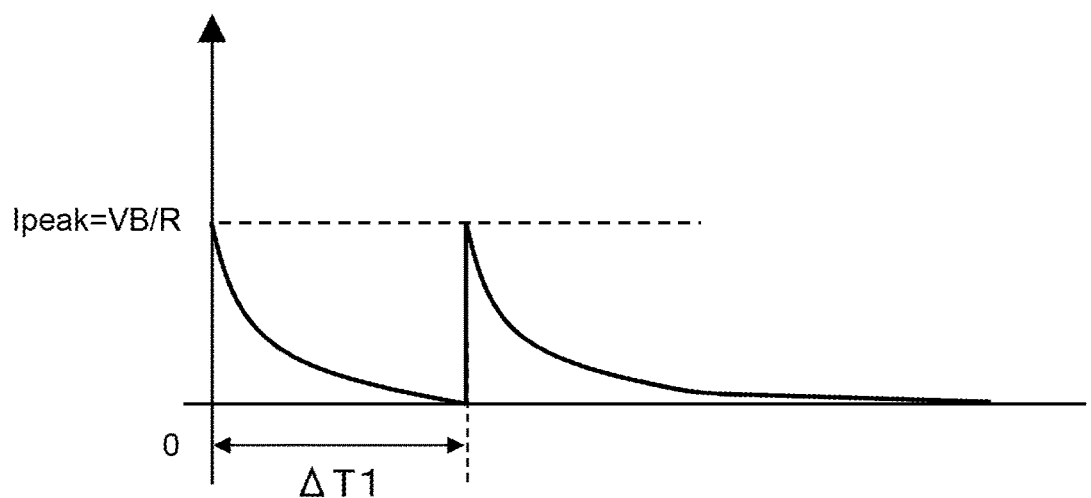
FIG. 6A is a waveform graph illustrating changes in the charging current supplied to the power supply stabilizing capacitors in the motor driving device according to the present invention when the pre-charge circuits of the two energization systems are driven at mutually different timings.
Figure 6B:
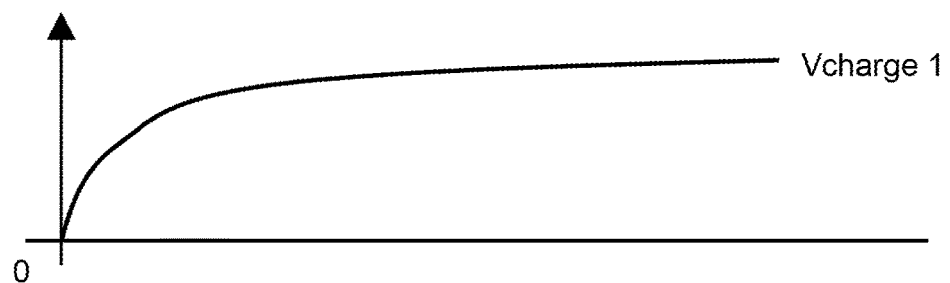
FIG. 6B is a waveform graph illustrating changes in the inter-terminal voltage of a power supply stabilizing capacitor in the motor driving device according to the present invention when the pre-charge circuits of the two energization systems are driven at mutually different timings.
Figure 6C:
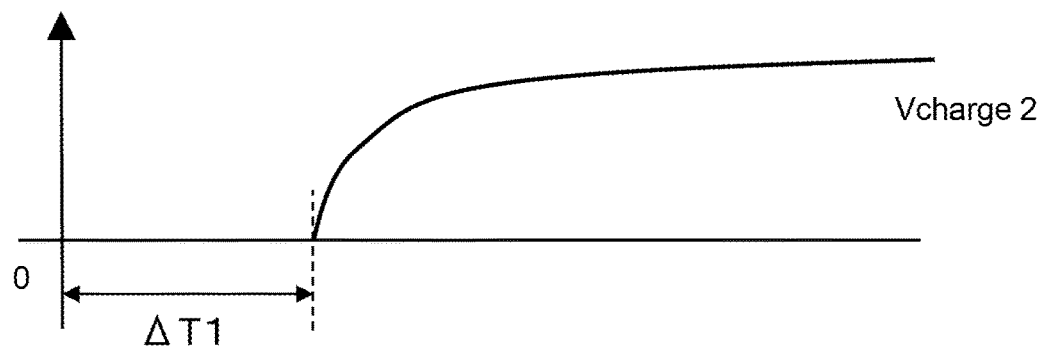
FIG. 6C is a waveform graph illustrating changes in the inter-terminal voltage of another power supply stabilizing capacitor in the motor driving device according to the present invention when the pre-charge circuits of the two energization systems are driven at mutually different timings.
Figure 7A:
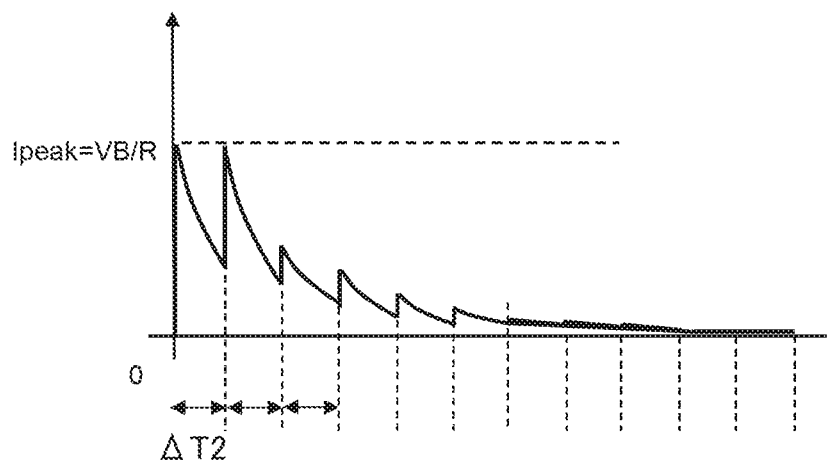
FIG. 7A is a waveform graph illustrating changes in the charging current supplied to the power supply stabilizing capacitors in the motor driving device according to the present invention when the pre-charge circuits of the two energization systems are driven alternately.
Figure 7B:
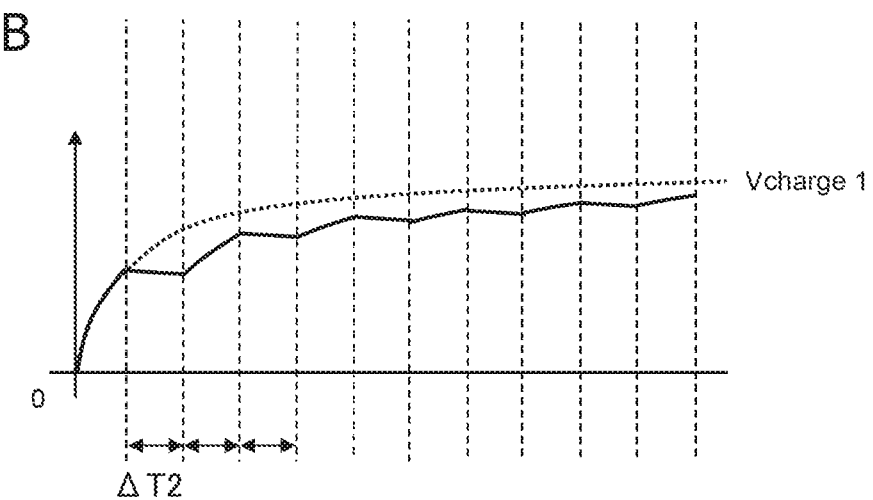
FIG. 7B is a waveform graph illustrating changes in the inter-terminal voltage of a power supply stabilizing capacitor in the motor driving device according to the present invention when the pre-charge circuits of the two energization systems are driven alternately.
Figure 7C:
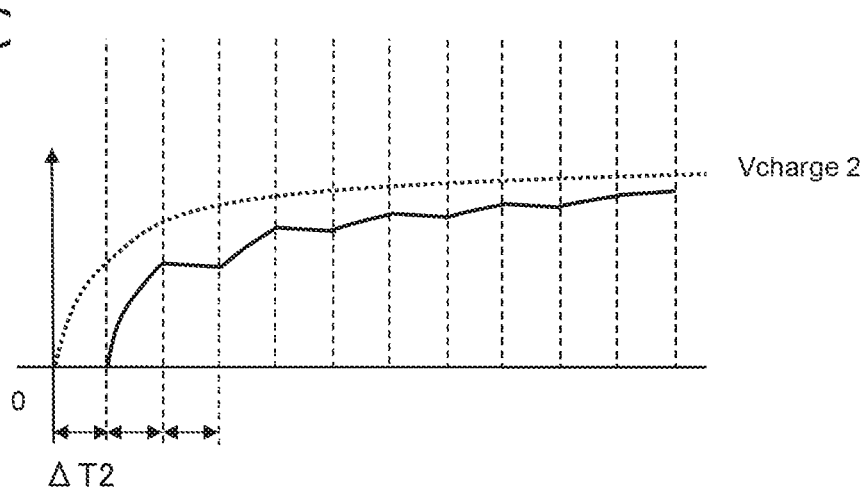
FIG. 7C is a waveform graph illustrating changes in the inter-terminal voltage of another power supply stabilizing capacitor in the motor driving device according to the present invention when the pre-charge circuits of the two energization systems are driven alternately.

FIGS. 4A and 4B, 5A to 5C, 6A to 6C, and 7A to 7C are graphs for comparison between conventional motor driving devices and the motor driving device according to the present invention, and illustrate changes in the charging currents supplied to the power supply stabilizing capacitors and changes in their inter-terminal voltages in the motor driving devices. FIGS. 4A and 4B are graphs obtained from a conventional motor driving device including a single energization system. FIGS. 5A to 5C are graphs obtained from a conventional motor driving device including two energization systems. FIGS. 6A to 6C are graphs obtained from the motor driving device according to the present invention when the pre-charge circuits of the two energization systems are driven at mutually different timings. FIGS. 7A to 7C are graphs obtained from the motor driving device according to the present invention when the pre-charge circuits of the two energization systems are driven alternately.

In a conventional motor driving device including a single energization system, the peak current Ipeak depends on the voltage VB of DC power supply 38, and the resistance value R of the charging path (Ipeak=VB/R) as illustrated in FIG. 4A, and the inter-terminal voltage Vcharge increases during charging, as illustrated in FIG. 4B. In a conventional motor driving device including two energization systems, the inter-terminal voltages Vcharge1 and Vcharge2 of two power supply stabilizing capacitors 29, 30 simultaneously increase during charging, as illustrated in FIGS. 5B and 5C. Thus, in this case, the peak current Ipeak is 2×(VB/R) as illustrated in FIG. 5A.

In contrast, when the pre-charge circuits of the two energization systems are driven at mutually different timings in the motor driving device according to the present invention, the inter-terminal voltages Vcharge1, Vcharge2 of the two power supply stabilizing capacitors increase with a mutual time lag ΔT1 during charging, as illustrated in FIGS. 6B and 6C. Thus, as illustrated in FIG. 6A, two current peaks occur with the mutual time lag ΔT1, and the peak current Ipeak is VB/R as in the conventional motor driving device including a single energization system. When the pre-charge circuits of the two energization systems are driven alternately in the motor driving device according to the present invention, the inter-terminal voltages Vcharge1, Vcharge2 of the two power supply stabilizing capacitors alternately increase with a mutual time lag ΔT2 during charging, as illustrated in FIGS. 7B and 7C. Thus, as illustrated in FIG. 7A, the peak current Ipeak is VB/R as in the conventional motor driving device including a single energization system.

As described above, when performing failure diagnosis on a plurality of relay circuits, the configuration according to the present invention drives a plurality of pre-charge circuits either at mutually different timings or alternately. Thereby, the configuration according to the present invention can control the pre-charge circuits such that the peak of the sum of the charging currents of the pre-charge circuits does not exceed a predetermined value. This eliminates the need to increase the resistance values of the resistors for limiting the peak currents, and also eliminates the need to increase the ratings of the elements such as functional units for protection against reverse connection of the power supply, thus suppressing the cost increase. Therefore, the present invention allows suppressing overall current consumption and cost without delaying the startup of the motor driving device.

Note that, in pre-charge circuits 33, 34 illustrated in FIG. 3, resistors R5, R10 may have the same resistance, and pre-charge circuits 33, 34 may be driven at mutually different timings or alternately. Alternatively, resistors R5, R10 may have different resistances from each other so as to provide different charging currents to the power supply stabilizing capacitors. When resistors R5, R10 have different resistances from each other, the peak of the sum of charging currents may be suppressed even when pre-charge circuit 33, 34 are simultaneously driven.

Second Embodiment

FIG. 8 is a diagram for illustrating a motor driving device according to a second embodiment of the present invention. Specifically, FIG. 8 illustrates another configuration example of the diagnosis control unit. In the circuit illustrated in FIG. 8, pre-charge circuits 33, 34, which have the circuit configurations illustrated in FIG. 3, are controlled by a diagnosis control unit 35-1 and a diagnosis control unit 35-2, respectively. Except for these, the circuit illustrated in FIG. 8 has basically the same configuration as the circuit illustrated in FIG. 3, and thus, the same reference numerals are given to the same components, and a detailed description thereof will be omitted. It is clear that the configuration in which pre-charge circuits 33, 34 are controlled individually by diagnosis control units 35-1 and 35-2 provides substantially the same advantageous effects as the circuit illustrated in FIG. 3.

Third Embodiment

Figure 9:
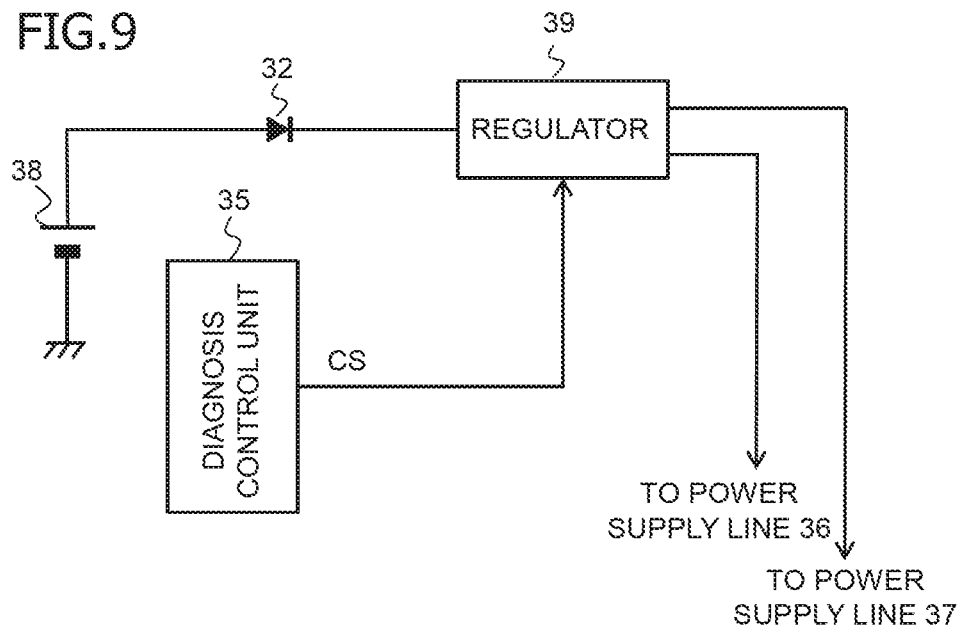
FIG. 9, which is a circuit diagram for illustrating a motor driving device according to a third embodiment of the present invention, illustrates another configuration example of the pre-charge circuits.

FIG. 9 is a diagram for illustrating a motor driving device according to a third embodiment of the present invention. Specifically, FIG. 9 illustrates another configuration example of the pre-charge circuits. In the circuit illustrated in FIG. 9, a regulator 39 serves as first and second pre-charge circuits 33, 34 of FIG. 2, and diagnosis control unit 35 controls regulator 39. Using the electric power from DC power supply 38, regulator 39 generates predetermined voltage and current for charging power supply stabilizing capacitors 29, 30. When failure diagnosis is performed on relay circuits 27, 28, power supply stabilizing capacitors 29, 30 are charged either at mutually different timings (with the predetermined mutual time lag ΔT1) or alternately for periods of time ΔT2. It is clear that such a configuration provides substantially the same advantageous effects as the circuit illustrated in FIG. 3.

Fourth Embodiment

Figure 10:
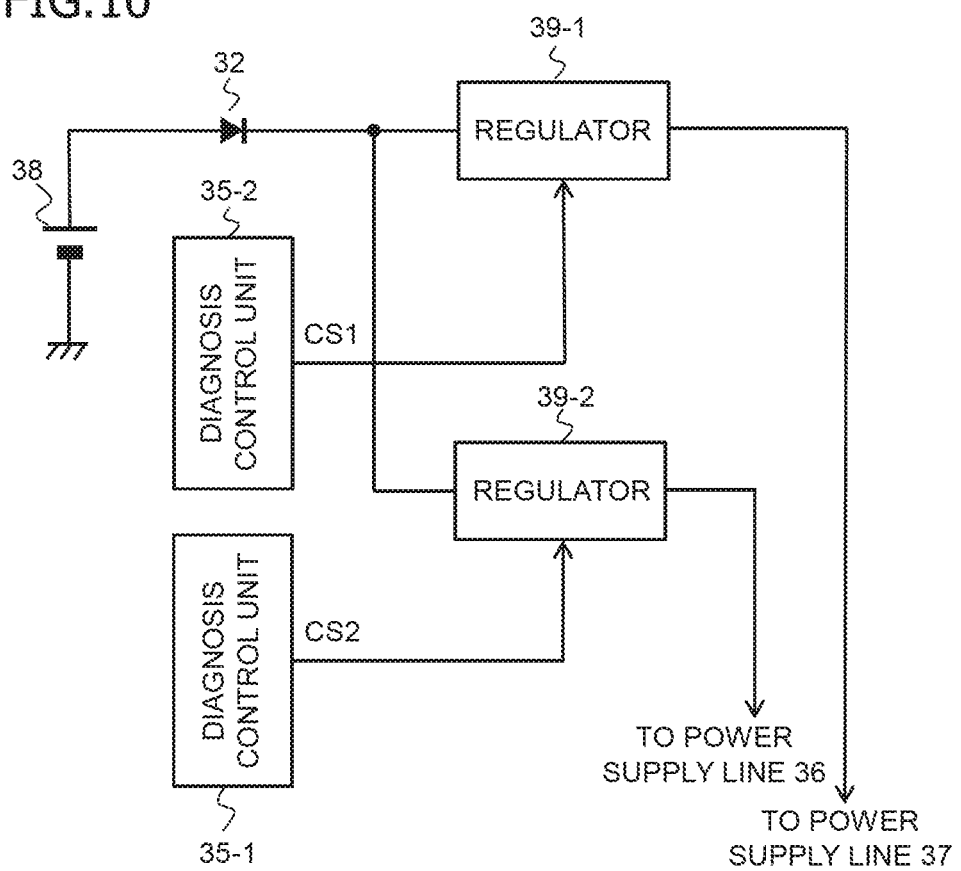
FIG. 10, which is a circuit diagram for illustrating a motor driving device according to a fourth embodiment of the present invention, illustrates another configuration example of the pre-charge circuits and diagnosis control unit.

FIG. 10 is a diagram for illustrating a motor driving device according to a fourth embodiment of the present invention. Specifically, FIG. 10 illustrates another configuration example of the pre-charge circuits and diagnosis control unit. In the circuit illustrated in FIG. 10, which includes two regulators 39-1, 39-2, diagnosis control unit 35-1 controls regulator 39-1 and diagnosis control unit 35-2 controls regulator 39-2. Except for these, the circuit illustrated in FIG. 10 has basically the same configuration as the circuit illustrated in FIG. 9, and thus, the same reference numerals are given to the same components, and a detailed description thereof will be omitted. It is clear that the configuration as illustrated in FIG. 10 provides substantially the same advantageous effects as the circuit illustrated in FIG. 9.

Fifth Embodiment

Figure 11:
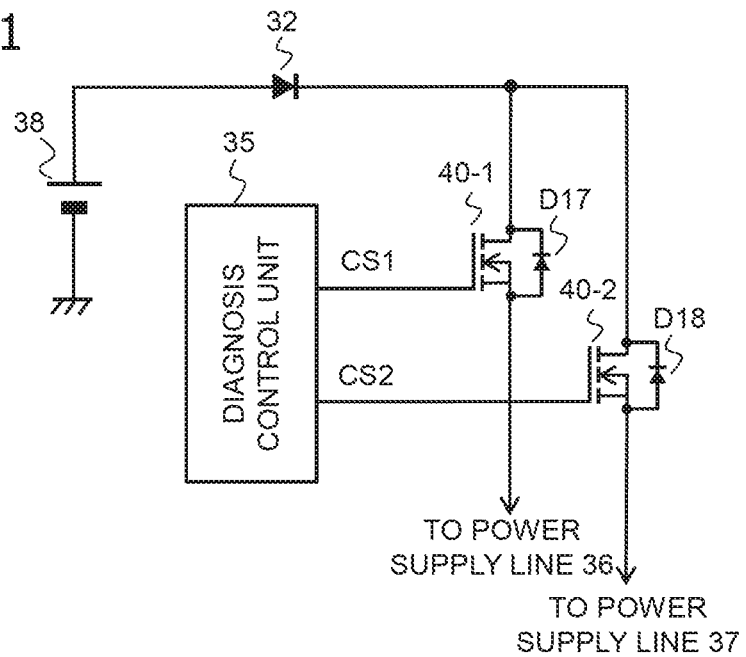
FIG. 11, which is a circuit diagram for illustrating a motor driving device according to a fifth embodiment of the present invention, illustrates still another configuration example of the pre-charge circuits.

FIG. 11 is a diagram for illustrating a motor driving device according to a fifth embodiment of the present invention. Specifically, FIG. 11 illustrates still another configuration example of the pre-charge circuits. In the circuit illustrated in FIG. 11, which further includes two switches (N-channel MOSFETs 40-1, 40-2 in this example), diagnosis control unit 35 controls the turning on and off of MOSFETs 40-1, 40-2. When failure diagnosis is performed on relay circuits 27, 28, power supply stabilizing capacitors 29, 30 are charged either at different timings (with the predetermined mutual time lag ΔT1) or alternately for periods of time ΔT2. It is clear that the on resistances of MOSFETs 40-1, 40-2 allows such a configuration to provide substantially the same advantageous effects as the circuit illustrated in FIG. 3.

Sixth Embodiment

Figure 12:
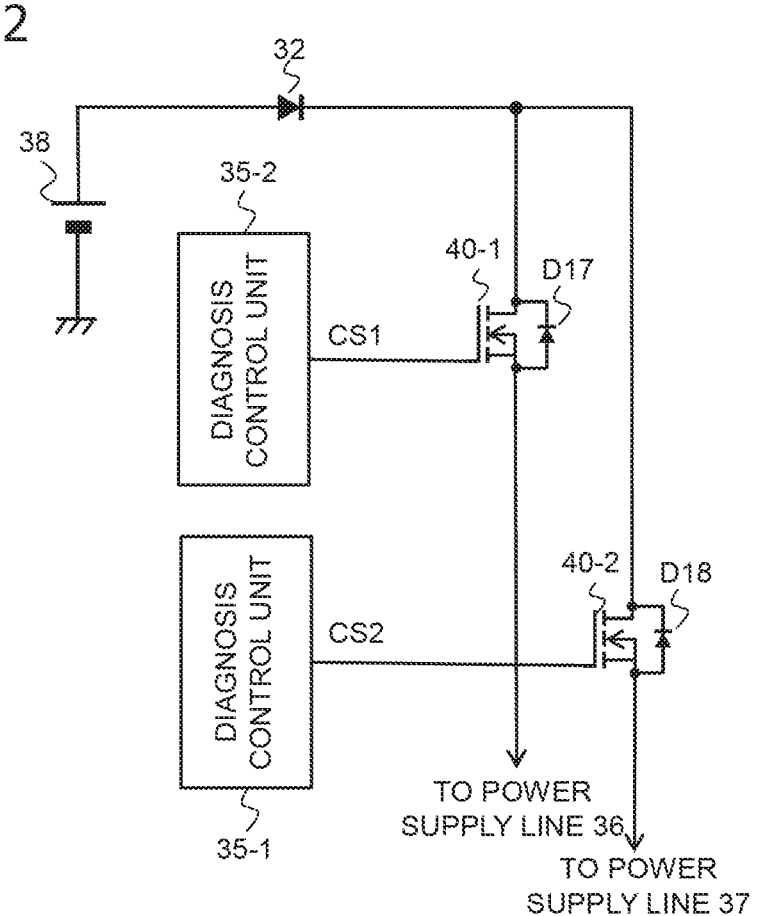
FIG. 12, which is a circuit diagram for illustrating a motor driving device according to a sixth embodiment of the present invention, illustrates still another configuration example of the pre-charge circuits and diagnosis control unit.

FIG. 12 is a diagram for illustrating a motor driving device according to a sixth embodiment of the present invention. Specifically, FIG. 12 illustrates still another configuration example of the pre-charge circuits and diagnosis control unit. In the circuit illustrated in FIG. 12, which includes two diagnosis control units 35-1, 35-2, diagnosis control unit 35-1 controls MOSFET 40-1 and diagnosis control unit 35-2 controls MOSFET 40-2. Except for these, the circuit illustrated in FIG. 12 has basically the same configuration as the circuit illustrated in FIG. 11, and thus, the same reference numerals are given to the same components, and a detailed description thereof will be omitted. It is clear that the configuration as illustrated in FIG. 12 provides substantially the same advantageous effects as the circuit illustrated in FIG. 11.

Note that the present invention is not limited to the first to sixth embodiments described above, and various modifications may be made without departing from the spirit of the present invention.

Modification 1

For example, although the first and second coil sets are driven by driver circuits of two energization systems in the above first to sixth embodiments, it is clear that the present invention may also be applied to a motor driving device including three or more energization systems and using the driver circuits of the three or more energization systems to drive a motor having three or more coil sets.

Modification 2

Although the motor driving device is applied to an EPS apparatus in the above embodiments, this is merely illustrative and the motor driving device according to the present invention may also be applied to various other apparatuses or systems, each having a motor that is driven by driver circuits of a plurality of energization systems.

Modification 3

Furthermore, although the motor driving device includes one or two control units dedicated to failure diagnosis in the above embodiments, this is merely illustrative, and it is clear that the main controller may further be configured to control the pre-charge circuits, one or more regulators, or switches.

REFERENCE SYMBOL LIST

13 Steering force assisting motor (motor)
14 Motor driving device
21, 22 Coil set
23, 24 Driver circuit
25, 26 Inverter circuit
27, 28 Relay circuit
29, 30 Power supply stabilizing capacitor
31 Main controller (control unit)
33, 34 Pre-charge circuit
35, 35-1, 35-2 Diagnosis control unit (control unit)
36, 37 Power supply line
38 DC power supply (power supply)
39, 39-1, 39-2 Regulator
40-1, 40-2 Switch

The invention claimed is:

1. A motor driving device for driving a motor including a plurality of coil sets, the motor driving device comprising:
   a plurality of inverter circuits for individually driving the plurality of coil sets;
   a plurality of relay circuits each provided between a power supply and a corresponding one of the plurality of inverter circuits;
   a plurality of power supply stabilizing capacitors each provided between a corresponding one of the plurality of relay circuits and a corresponding one of the plurality of inverter circuits;
   a plurality of pre-charge circuits provided corresponding individually to the plurality of power supply stabilizing capacitors, each pre-charge circuit charging a corresponding one of the power supply stabilizing capacitors before the plurality of relay circuits are driven; and
   a control unit for controlling the plurality of pre-charge circuits so that the plurality of pre-charge circuits charge the plurality of power supply stabilizing capacitors at mutually different timings or alternately when failure diagnosis is performed on the plurality of relay circuits.

2. The motor driving device according to claim 1, wherein the control unit includes a plurality of diagnosis control units provided corresponding individually to the plurality of pre-charge circuits.

3. The motor driving device according to claim 1, wherein the control unit further controls the plurality of inverter circuits and the plurality of relay circuits.

4. The motor driving device according to claim 1, the control unit controls the plurality of pre-charge circuits so that a peak of a sum of charging currents of the pre-charge circuits does not exceed a predetermined value.

5. The motor driving device according to claim 4, wherein each of the plurality of relay circuits includes a MOSFET, and
   the predetermined value is equal to or below a gate dielectric breakdown voltage of the MOSFET.

6. The motor driving device according to claim 1, wherein the plurality of pre-charge circuits include charging paths from the power supply to the power supply stabilizing capacitors, the charging paths having mutually different resistance values.

7. The motor driving device according to claim 1, wherein the plurality of pre-charge circuits include a regulator for generating predetermined voltage and current using electric power from the power supply.

8. The motor driving device according to claim 1, wherein each of the plurality of pre-charge circuits includes a switch provided in a charging path from the power supply to a corresponding one of the power supply stabilizing capacitors, and
   the control unit controls turning on and off of the switches.

9. The motor driving device according to claim 1, wherein each of the plurality of relay circuits includes a power supply relay, a reverse-connection shut-off relay connected in series with the power supply relay, and a pull-down resistor which discharges an electric charge at a connection point between the power supply relay and the reverse-connection shut-off relay when failure diagnosis is performed on the relay circuit.

10. A failure diagnosis method for a motor driving device for driving a motor including a plurality of coil sets, the motor driving device including a plurality of inverter circuits for individually driving the plurality of coil sets; a plurality of relay circuits each provided between a power supply and a corresponding one of the plurality of inverter circuits; a plurality of power supply stabilizing capacitors each provided between a corresponding one of the plurality of relay circuits and a corresponding one of the plurality of inverter circuits; and a plurality of pre-charge circuits provided corresponding individually to the plurality of power supply stabilizing capacitors, each pre-charge circuit charging a corresponding one of the power supply stabilizing capacitors before the plurality of relay circuits are driven, the failure diagnosis method comprising the steps of:
   causing the plurality of pre-charge circuits to charge the plurality of power supply stabilizing capacitors at mutually different timings or alternately;
   driving the plurality of relay circuits after charging of the plurality of power supply stabilizing capacitors has been completed;
   measuring voltages of the plurality of relay circuits; and
   identifying failure based on the measured voltages of the plurality of relay circuits.

11. The failure diagnosis method for the motor driving device according to claim 10, wherein
   each of the plurality of relay circuits includes a power supply relay, a reverse-connection shut-off relay connected in series with the power supply relay, and a pull-down resistor for discharging an electric charge at a connection point between the power supply relay and the reverse-connection shut-off relay, and
   in the step of identifying failure, a short circuit failure or a disconnection failure is detected based on measurement of a voltage at the connection point between the power supply relay and the reverse-connection shut-off relay.

12. An electric power steering apparatus which uses a motor driving device to control a steering force assisting motor including a plurality of coil sets so that the steering force assisting motor produces a steering assist force in accordance with a traveling state of a vehicle,
   wherein the motor driving device includes:
      a plurality of inverter circuits for individually driving the plurality of coil sets of the steering force assisting motor;
      a plurality of relay circuits each provided between a power supply and a corresponding one of the plurality of inverter circuits;
      a plurality of power supply stabilizing capacitors each provided between a corresponding one of the plurality of relay circuits and a corresponding one of the plurality of inverter circuits;
      a plurality of pre-charge circuits provided corresponding individually to the plurality of power supply stabilizing capacitors, each pre-charge circuit charging a corresponding one of the power supply stabilizing capacitors before the plurality of relay circuits are driven; and
      a control unit for controlling the plurality of pre-charge circuits so that the plurality of pre-charge circuits charge the plurality of power supply stabilizing capacitors at mutually different timings or alternately when failure diagnosis is performed on the plurality of relay circuits.

13. The electric power steering apparatus according to claim 12, wherein the control unit includes a plurality of diagnosis control units provided corresponding individually to the plurality of pre-charge circuits.

14. The electric power steering apparatus according to claim 12, wherein the control unit further controls the plurality of inverter circuits and the plurality of relay circuits.

15. The electric power steering apparatus according to claim 12, the control unit controls the plurality of pre-charge circuits so that a peak of a sum of charging currents of the pre-charge circuits does not exceed a predetermined value.

16. The electric power steering apparatus according to claim 15, wherein
each of the plurality of relay circuits includes a MOSFET, and
the predetermined value is equal to or below a gate dielectric breakdown voltage of the MOSFET.

17. The electric power steering apparatus according to claim 12, wherein the plurality of pre-charge circuits include charging paths from the power supply to the power supply stabilizing capacitors, the charging paths having mutually different resistance values.

18. The electric power steering apparatus according to claim 12, wherein the plurality of pre-charge circuits include a regulator for generating predetermined voltage and current using electric power from the power supply.

19. The electric power steering apparatus according to claim 12, wherein
each of the plurality of pre-charge circuits includes a switch provided in a charging path from the power supply to a corresponding one of the power supply stabilizing capacitors, and
the control unit controls turning on and off of the switches.

20. The electric power steering apparatus according to claim 12, wherein each of the plurality of relay circuits includes a power supply relay, a reverse-connection shut-off relay connected in series with the power supply relay, and a pull-down resistor which discharges an electric charge at a connection point between the power supply relay and the reverse-connection shut-off relay when failure diagnosis is performed on the relay circuit.

* * * * *